(12) United States Patent
Ruesch

(10) Patent No.: US 6,433,627 B1
(45) Date of Patent: Aug. 13, 2002

(54) GTL+ONE-ONE/ZERO-ZERO DETECTOR

(75) Inventor: Rodney Ruesch, Eau Claire, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/621,312

(22) Filed: Jul. 20, 2000

(51) Int. Cl.[7] ............................................. G06G 7/12
(52) U.S. Cl. ........................................ 327/563; 327/78
(58) Field of Search ............................. 327/63, 64, 65, 327/68, 69, 71, 72, 75, 76, 78, 79, 82, 89, 90, 560, 561, 563

(56) References Cited

U.S. PATENT DOCUMENTS

| | | | |
|---|---|---|---|
| 5,023,488 A | 6/1991 | Gunning | 307/475 |
| 5,483,188 A | 1/1996 | Frodsham | 327/170 |
| 5,661,415 A | 8/1997 | Aoki et al. | 326/82 |
| 5,701,331 A * | 12/1997 | Hunt | 375/316 |
| 5,781,050 A | 7/1998 | Russell | 327/170 |
| 5,852,372 A | 12/1998 | Boeckmann et al. | 326/83 |
| 5,889,419 A * | 3/1999 | Fischer et al. | 327/70 |
| 5,940,448 A | 8/1999 | Kuo | 375/316 |
| 5,966,032 A | 10/1999 | Elrabaa et al. | 326/84 |
| 5,973,515 A * | 10/1999 | Marbot et al. | 327/65 |
| 6,040,732 A * | 3/2000 | Brokaw | 327/408 |
| 6,078,978 A | 6/2000 | Suh | 710/129 |
| 6,160,423 A * | 12/2000 | Haq | 327/41 |
| 6,184,717 B1 * | 2/2001 | Crick | 326/86 |

* cited by examiner

Primary Examiner—My-Trang Nuton
(74) Attorney, Agent, or Firm—Schwegman, Lundberg, Woessner & Kluth, P.A.

(57) ABSTRACT

A receiver operable with a single power supply provides, among other things, both differential and single ended signal detection with selectable noise margins. The output signals of differential amplifiers with hysteresis are coupled to logic gates. Internal test circuitry is also provided.

32 Claims, 18 Drawing Sheets

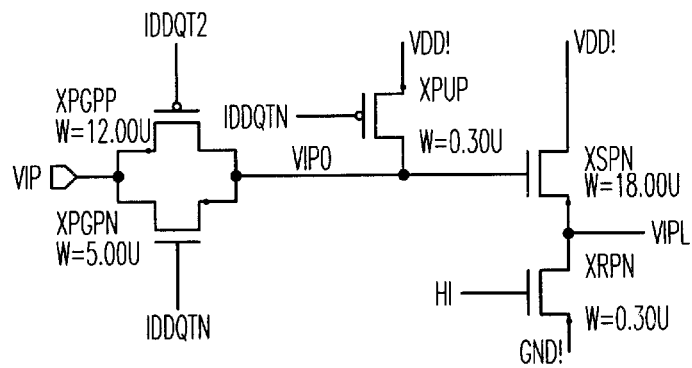
Fig.5A
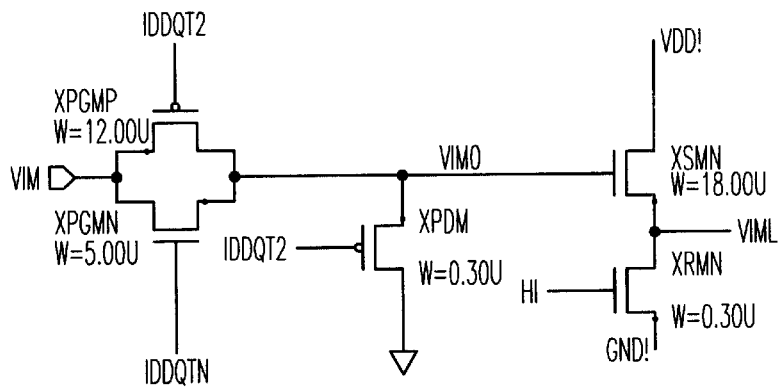
Fig.5B
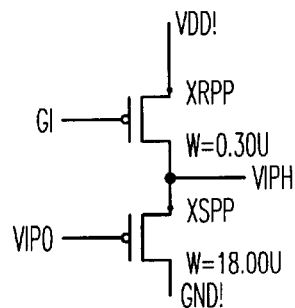     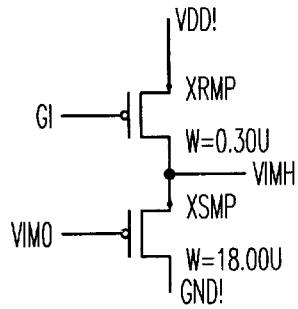
Fig.5C           Fig.5D

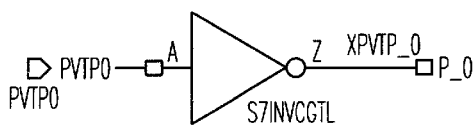
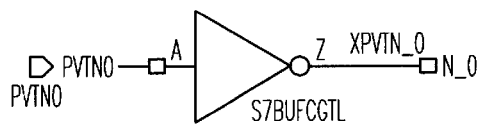
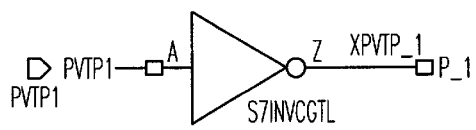
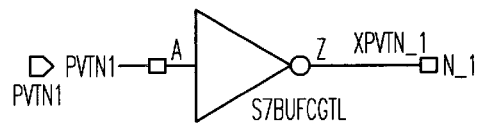
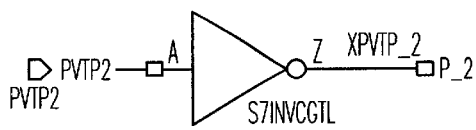
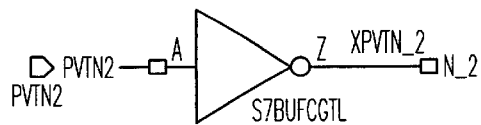
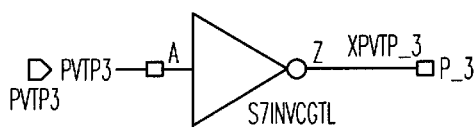
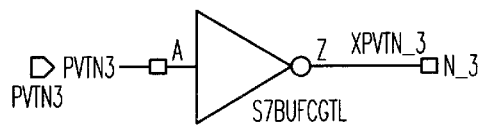
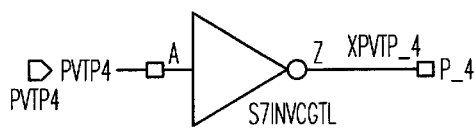
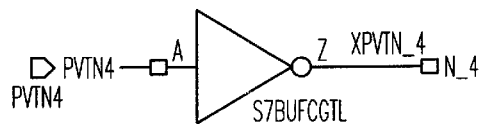
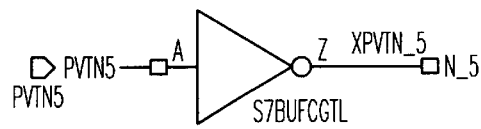
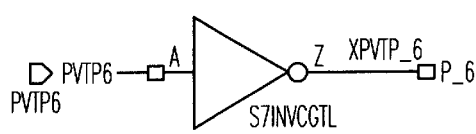
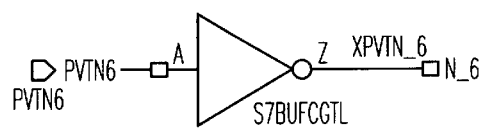
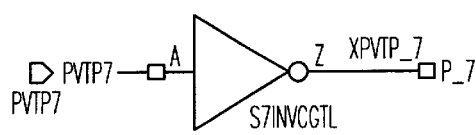
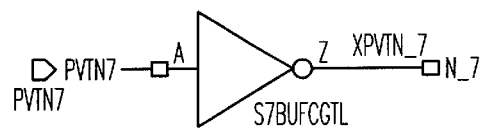
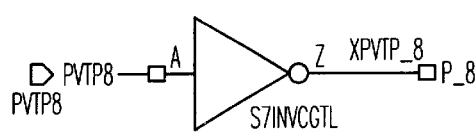
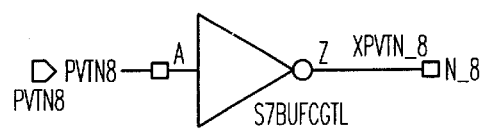
Fig.6B

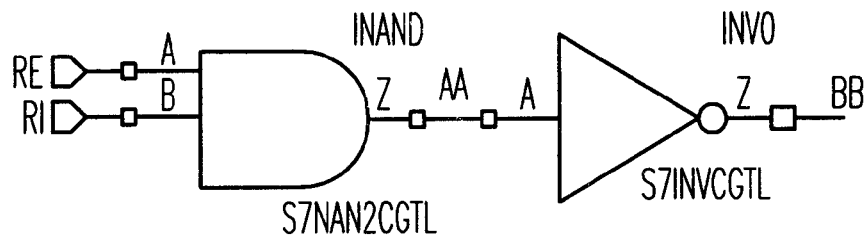
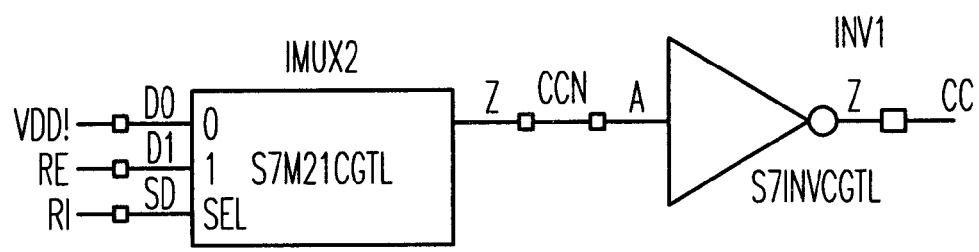
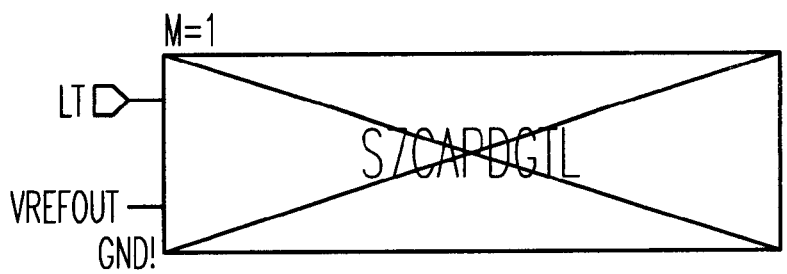
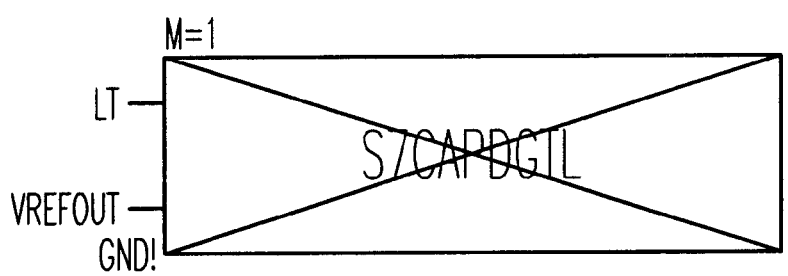
Fig.7-2

DESCRIPTION:
NON-INVERTING BI-DIRECTIONAL DRIVER/RECEIVER THAT INTERFACES 1.8V INTERNAL FUNCTIONS WITH 1.1V ENHANCED GTL+ OFF-CHIP BI-DIRECTIONAL DATA BUS. THE DRIVER OPERATES WITH A 1.8V SUPPLY. THE DRIVER HAS OFF-CHIP TERMINATION OF 45 OHM TO 1.1V ($V_{TT}$) AT EACH END OF THE BUS (DOUBLE TERMINATION). THE RECEIVER HAS EXTERNAL REFERENCE $V_{ref}$ ($V_{TT}*2/3$).

| | |
|---|---|
| A0 | DRIVER DATA0 INPUT |
| A1 | DRIVER DATA1 INPUT |
| AN0 | DRIVER DATA0 INPUT |
| AN1 | DRIVER DATA1 INPUT |
| SA | DRIVER DATA SELECT INPUT |
| DI | DRIVER INHIBIT INPUT (DI IN) |
| TS | IN-PHASE DRIVER THREE-STATE CONTROL |
| TSN | OUT-PHASE DRIVER THREE-STATE CONTROL |
| PVTP[8:0] | PMOS EDGE RATE CONTROL BUS INPUT |
| PVTN[8:0] | NMOS IMPEDANCE CONTROL BUS INPUT |
| RE | REFERENCE ENABLE |
| RI | RECEIVER INHIBIT INPUT (RI IN) |
| VREF | ($V_{tt}*2/3$) INPUT SIGNAL |
| PAD | IN-PHASE DRIVER OUTPUT/RECEIVER INPUT |
| PADN | OUT-PHASE DRIVER OUTPUT/RECEIVER INPUT |
| ZDI | DRIVER INHIBIT OUTPUT (DI OUT) |
| ZRI | RECEIVER INHIBIT OUTPUT (RI OUT) |
| Z | IN-PHASE RECEIVER OUTPUT |
| ZN | OUT-PHASE RECEIVER OUTPUT |
| ZA | DATA0 TEST OUTPUT (A0 OR A1 OUT) |
| ZAN | DATAN0 TEST OUTPUT (AN0 OR AN1 OUT) |
| ZBSR | PAD TEST OUTPUT (PAD OUT) |
| ZNBSR | PADN TEST OUTPUT (PADN OUT) |
| LT | LEAKAGE TEST INPUT |

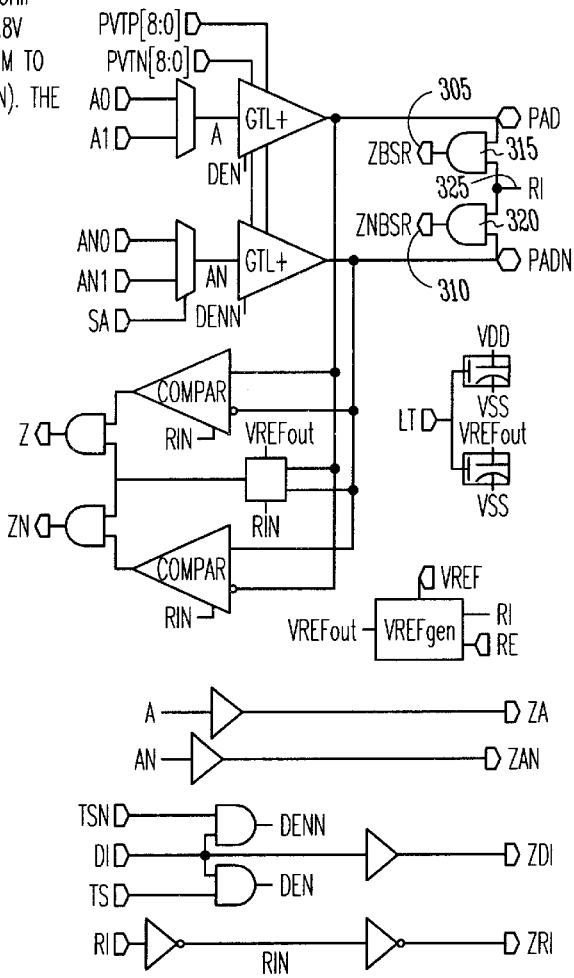

Fig.8

RECEIVER TRUTH TABLE

| INPUTS | | | | OUTPUTS | | | | | COMMENTS |
|---|---|---|---|---|---|---|---|---|---|
| PAD | PADN | RI | RE | Z | ZN | ZBSR | ZNBSR | ZRI | |
| - | - | 0 | - | 0 | 0 | 0 | 0 | RI | RECEIVE INHIBIT MODE(LEAKAGE)¹ |
| 12 | 03 | 1 | S5 | 1 | 0 | PAD | PADN | RI | FUNCTIONAL MODE⁴ |
| 03 | 12 | 1 | S5 | 0 | 1 | PAD | PADN | RI | FUNCTIONAL MODE⁴ |
| 1 | 1 | 1 | S5 | 0 | 1 | PAD | PADN | RI | FUNCTIONAL MODE⁴ |
| 0 | 0 | 1 | S5 | 1 | 1 | PAD | PADN | RI | FUNCTIONAL MODE⁴ |

1. LT IS 1 FOR THE LEAKAGE TEST TO DISABLE THE PCDCAPS, OTHERWISE LT IS ALWAYS AT 0.
2. PAD INPUT IS GTL+LEVEL "HIGH".
3. PAD INPUT IS GTL+LEVEL "LOW".
4. Z AND ZN ARE UNKNOWN WHEN PAD OR PADN ARE UNKNOWN.
5. WHEN S='0' THE EXTERNAL REFERENCE SIGNAL (VREF) IS USED (SYSTEM MODE).
   WHEN S='1' THE 733MV (Vdd*733/1800) INTERNAL REFERENCE IS USED (TEST MODE).

Fig.10

GTL+ONE-ONE/ZERO-ZERO DETECTOR

TECHNICAL FIELD OF THE INVENTION

The present invention relates generally to data communications between electronic devices and particularly, but not by way of limitation, to a receiver for high speed data communications.

BACKGROUND

Communication of binary digital data in electronic circuits often entails the transmission of complementary signals. Such signals are often referred to as differential signals since the data is propagated at both logic levels. In other words, one line may be at logic one and the other at logic zero. Signals may also be transmitted in single ended mode wherein both lines are at the same logic level, namely one-one or zero-zero. Single ended mode may be used during tristate, or high impedance, mode. During tristate mode, the bus is turned around and a different agent may be providing a driving signal.

Problems may arise when it becomes important to reliably distinguish between a single ended signal and a differential mode signal in transition from one state to another. For some receivers, receiving a single ended signal may trigger an unstable condition and cause the receiver output to become unpredictable. Further problems arise in that undesirable noise may blur the distinction between single ended and differential signals. Increasing the spread between a high and low logic level may provide an increased noise margins, however it may also frustrate the objective of communicating high speed data. Requiring the signal to switch across a greater voltage differential requires a longer time period and thus further slowing the speed of data transmission.

What is needed in the art is a system responsive to single ended input signals and differential input signals which is reliably operable at high data communication speeds.

SUMMARY

The above mentioned problems associated with receivers, and other problems, are addressed by the present invention and will be understood by reading and studying the following specification.

In particular, an illustrative embodiment of the present invention includes a receiver having a reference input signal node for receiving a reference input signal, a first input signal node for receiving a first input signal, a second input signal node for receiving a second input signal concurrent with the first input signal, a first comparator coupled to the first input signal node, the second input signal node and the reference input signal node. The first comparator generates a first output and a second output based on the input signals. The receiver also includes a second comparator coupled to the first input signal node and the second input signal node. The second comparator generates a third output and fourth output based on the first input signal and the second input signal. The receiver also includes a logic array having a first input coupled to the first output, a second input coupled to the second output, a third input coupled to the third output, and a fourth input coupled to the fourth output. The logic has a first output signal node and a second output signal node wherein the first output signal node provides a first output signal and the second output signal node provides a second output signal. The first and second output signals are based on the first input, second input, third input and fourth input.

In one embodiment, the first comparator includes a first differential amplifier and a second differential amplifier. In one embodiment, the logic array includes a logical exclusive or gate. In one embodiment, the logic array includes a plurality of logical invertors. In one embodiment, the logic array includes a multiplexer.

One illustrative embodiment includes a circuit having a first differential amplifier, second differential amplifier and a third differential amplifier. The first differential amplifier includes a first output coupled to a first input of an exclusive or gate, a first input coupled to a first input node, and a second input coupled to a reference voltage. The second differential amplifier includes a first output coupled to a second input of the exclusive or gate, the exclusive or gate having an exclusive or gate output coupled to a first input of a first and gate, the exclusive or gate output further coupled to a first input of a second and gate. The second differential amplifier also includes a first input coupled to a second input node and a second input coupled to the reference voltage. The third differential amplifier includes a first output coupled to an input of a first delay, the first delay having an output coupled to a second input of the first and gate, the first and gate having an output coupled to a first output node. The third differential amplifier also includes a second output coupled to an input of a second delay, the second output having a state complementary to the first output of the third differential amplifier, the output of the second delay coupled to a second input of the second and gate, the second and gate having an output coupled to a second output node. The circuit also includes a first input coupled to the first input node and a second input coupled to the second input node.

In one embodiment, the first output of the first differential amplifier is delayed by a predetermined time period after receipt of a signal on the first input of the first differential amplifier and receipt of a signal on the second input of the first differential amplifier. In addition, the first output of the second differential amplifier is delayed by the predetermined time period after receipt of a signal on the first input of the second differential amplifier and receipt of a signal on the second input of the second differential amplifier. Furthermore, the first output of the third differential amplifier and the second output of the third differential amplifier is delayed by the predetermined time period after receipt of a signal on the first input of the third differential amplifier and receipt of a signal on the second input of the third differential amplifier. In one embodiment, the reference voltage is between a voltage representing a logical one and a voltage representing a logical zero. In one embodiment, the reference voltage is substantially midway between a voltage representing a logical one and a voltage representing a logical zero. In one embodiment, the first delay comprises a first logic gate and the second delay comprises a second logic gate. In one embodiment, the first delay comprises a first plurality of series connected invertors and the second delay comprises a second plurality of series connected invertors. In one embodiment, the first delay has a first propagation delay time and the second delay has a second propagation delay time and the first propagation delay time is approximately equal to the second propagation delay time. In one embodiment, the first delay has a first propagation delay time and the exclusive or gate has a second propagation delay time and the first propagation delay time is approximately equal to the second propagation delay time. In one embodiment, the first output of the first differential amplifier changes state if the first input of the first differential amplifier and the second input of the first differential amplifier differs by a predetermined amount. In one embodiment, the first output of the first differential amplifier changes state if the first input of the first differential amplifier and the second input of the first differential amplifier differs by approximately 200 millivolts. In one embodiment, the first differential amplifier comprises a cross coupled latch having relatively large transistors.

One illustrative embodiment of the present invention includes a circuit having four differential amplifiers, an exclusive or gate, a nor gate, three delays, two and gates and two multiplexers. The first differential amplifier has a first output and two inputs, with one input coupled to a first input node and a second input coupled to a reference voltage. The second differential amplifier has an output and a first input coupled to a second input node and a second input coupled to the reference voltage. The exclusive or gate has a first and second input, with one input coupled to the first differential amplifier output and second input coupled to the second differential amplifier output. The nor gate has a first and second input coupled in parallel with the input to the exclusive or gate. The first delay is coupled between the nor gate output and the selector inputs to the first and second multiplexers. The third and fourth differential amplifier are each coupled to the first input node and to the second input node. The second delay is coupled to the third differential amplifier output and the third delay is coupled to the fourth differential amplifier output. The first and gate is coupled to the output of the second delay and to the exclusive or gate output. The second and gate is coupled to the output of the third delay and to the exclusive or gate output. The output of the first multiplexer is coupled to a first output node and a first input is coupled to the output of the first and gate output and the second input is coupled to a supply voltage. The output of the second multiplexer is coupled to a second output node and a first input is coupled to the output of the second and gate and a second input is also coupled to the supply voltage.

In one embodiment, the first delay includes a plurality of invertors. In one embodiment, the reference voltage is less than the supply voltage. In one embodiment, the reference voltage is approximately two thirds of the supply voltage. In one embodiment, the first differential amplifier, the second differential amplifier, the third differential amplifier and the fourth differential amplifier are approximately the same.

One illustrative embodiment of the present invention includes a method comprising receiving a first input signal, receiving a second input signal at a time concurrent with receipt of the first input signal, adding a predetermined time lag to the first input signal to create a delayed first input signal, and adding the predetermined time lag to the second input signal to create a delayed second input signal. The method continues with setting a first signal line based on a comparison of the delayed first input signal with the delayed second input signal, setting a second signal line based on the comparison of the delayed first input signal with the delayed second input signal, the second signal line complementary to the first signal line and setting a third signal line based on a comparison of the delayed first input signal with a reference signal. The method also includes setting a fourth signal line based on a comparison of the delayed second input signal with the reference signal, executing a logical exclusive or function using the third signal line and the fourth signal line to create a fifth signal, adding a predetermined delay to the first signal line to create a delayed first signal line, adding the predetermined delay to the second signal line to create a delayed second signal line, executing a logical and function using the fifth signal line and the delayed first signal line to create a first output, and executing a logical and function using the fifth signal line and the delayed second signal line to create a second output.

In one embodiment, the method provides that setting a first signal line includes processing using a differential amplifier. In one embodiment, setting a third signal line includes processing using a differential amplifier. In one embodiment, adding a predetermined delay includes executing a plurality of logical gates.

BRIEF DESCRIPTION OF THE DRAWINGS

In the drawings, like numerals describe substantially similar components throughout the several views, with alphabetic suffixes indicating different instances of similar components.

FIG. 8 is a block diagram schematic illustrating generally one embodiment of the present system and an environment in which it operates.

FIG. 10 illustrates a truth table for one embodiment of the present system.

DETAILED DESCRIPTION

In the following detailed description, reference is made to the accompanying drawings which form a part hereof, and in which is shown by way of illustration specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense.

Figure 1A:
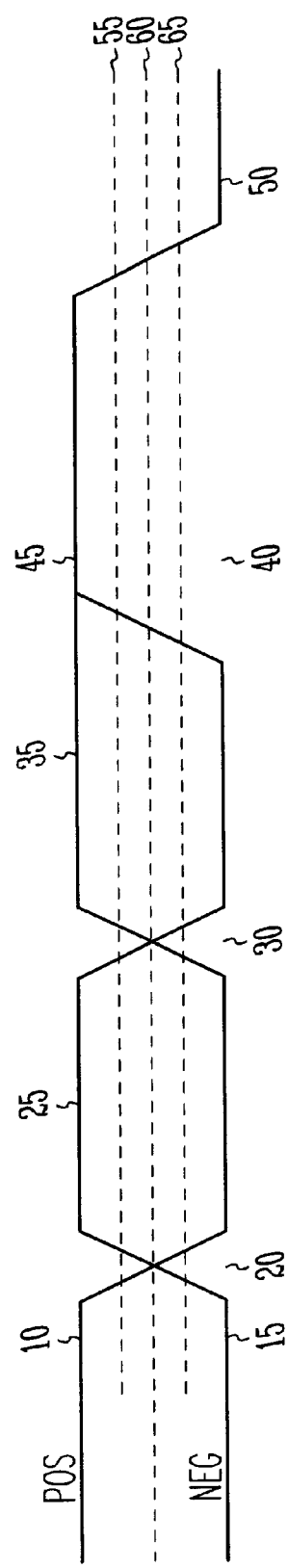
FIGS. 1A and 1B are timing diagrams illustrating voltage levels as a function of time.

FIG. 1A illustrates a timing diagram depicting voltage levels as a function of time. At the beginning of the timing diagram, first signal line 10 has a high logic level, denoted herein as POS (referring to positive). The high logic level may correspond to a logical "1" state. At a similar time, signal line 15 has a low logic level, denoted herein as NEG (referring to negative). The low logic level may correspond to a logical "0" state. During the time period approximately denoted by 20, both line 10 and line 15 are in transition. It will be noted that both line 10 and line 15 are symmetrical, namely, each line commenced the transition to the opposite state at approximately the same time and each line proceeds at approximately the same slew rate. During the time period near region 25, line 15 has a POS value and line 10 has a NEG value. The time near region 30 denotes another transition. At time 35, line 10 and line 15 have returned to their initial state.

At time 40, the symmetry of movement between line 10 and line 15 ends. At time 40, line 15 is transitioning to a high level while line 10 remains high. At 45, both line 10 and line 15 are at POS, or high. Later, at time 50, both line 10 and line 15 are at NEG, or low. During time near 45 and 50, the communication bus is operating in a single ended mode, whereas, at other times in the figure, the bus is operating in differential mode.

The signals described with respect to FIG. 1A may represent the output of a driver circuit, in which case, ignoring effects of noise, delay, and other factors, it also represents the signals received at the input of a receiver.

If it is assumed that the timing diagram of FIG. 1A represents input signals to a receiver, then the output of the receiver will differ according to the type of receiver. The output signal from a differential mode receiver may become unstable, and thus, unpredictable during region 45 or region 50. The present subject matter, however, properly discerns the output signal. As used herein, the term receiver includes systems for detecting a logical 1–1 state and a logical 0–0 state.

Table 1 illustrates the desired truth table for a receiver of one embodiment of the resent subject matter. In the table, PAD and PADN represent the input terminals, or odes, to the receiver, and Z and ZN represent the output terminals, or nodes. In the able, "0" denotes a logical low level and "1" represents a logical high level, however, in another embodiment this may be reversed.

TABLE 1

| PAD | PADN | Z | ZN |
|-----|------|---|----|
| 0   | 0    | 1 | 1  |
| 0   | 1    | 0 | 1  |
| 1   | 0    | 1 | 0  |
| 1   | 1    | 0 | 0  |

It will be noted that during differential mode operation, as shown in the second and third line of tabulated data, PAD and Z track together and PADN and ZN track together. It can be said that PAD and PADN are complementary signals. During single ended mode operation, as shown in the first and fourth line of tabulated data, PAD and PADN are at the same logic level and Z and ZN are at the same logic level. In addition, for the embodiment shown, PAD and PADN are opposite that of Z and ZN. In one embodiment, PAD and PADN match the logic level of Z and ZN.

Figure 1B:
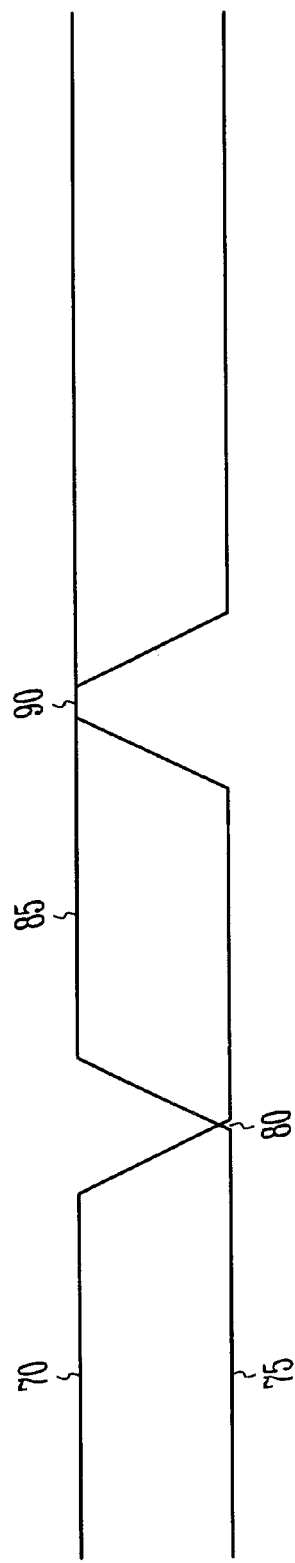

FIG. 1B shows a timing diagram concerning signal lines 70 and 75. FIG. 1B illustrates examples of digital signals that may be applied to the input of a receiver. For purposes of this discussion, consider FIG. 1B to show input signals to a receiver. Initially, lines 70 and 75 are at logical high and low, respectively. At a later time, line 70 commences a transition to a low level. At an even later time, line 75 commences a transition to a high level. At time 80, lines 70 and 75 reach a cross over point. The cross over point of line 70 and 75 is displaced such that a differential receiver may not properly discern that the lines are in transition. Some differential receivers may become unstable and generate an unpredictable output. At time 85, lines 70 and 75 are again at a differential mode. Time 90 illustrates an example where the logic level of one line is approaches the logic level of another line. At time 90, line 70 displays a glitch wherein the logic level rises to a high and then quickly transitions again to a low. The output of a receiver at time 90 may be unpredictable.

Figure 2:
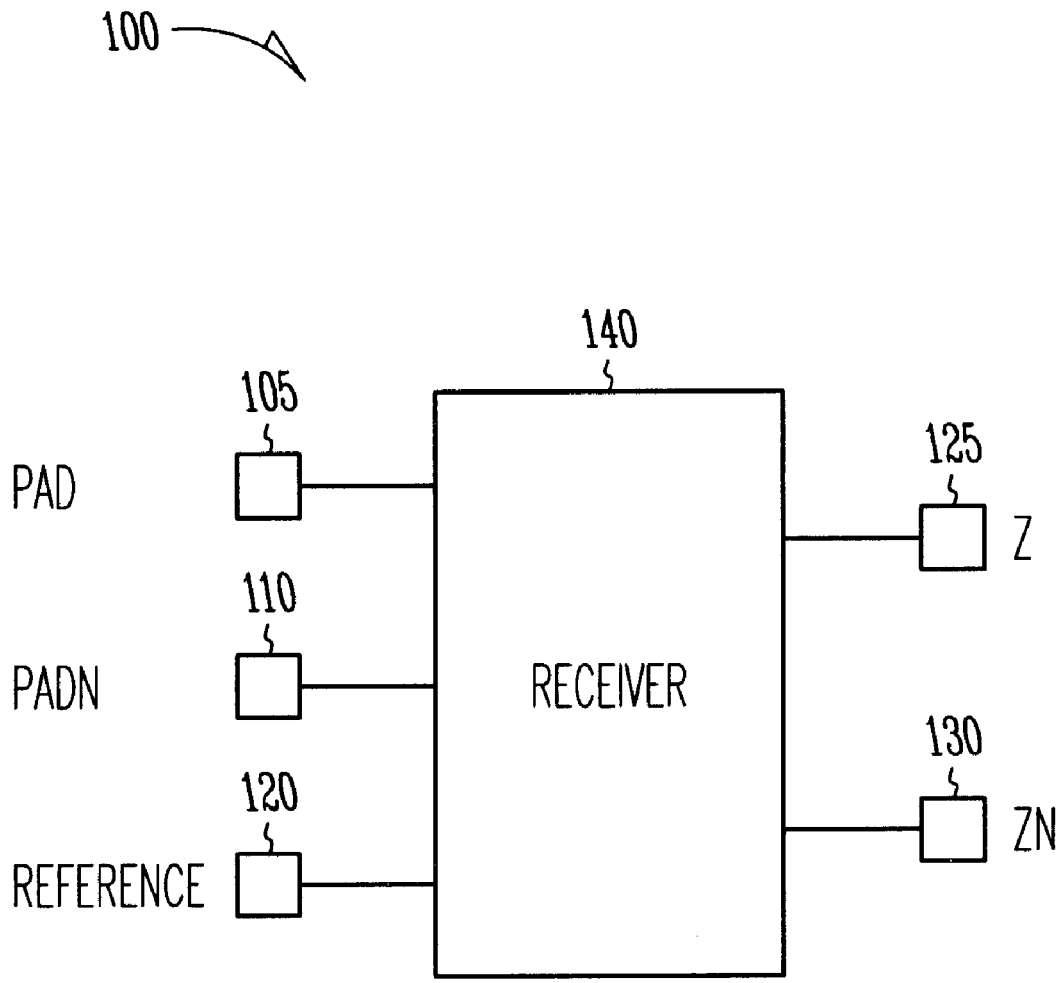
FIG. 2 is a block diagram illustrating generally a portion of one embodiment of the present system.

FIG. 2 illustrates generally a model of one embodiment of present system 100. Node 105 represents a first input node, herein labeled PAD. Node 110 represents a second input node, herein labeled PADN. Node 120 represents a voltage reference input. Node 125 and node 130 represent first and second output nodes, herein labeled Z and ZN, respectively. According to one embodiment of system 100, receiver 140 implements the logic illustrated in Table 1. Other logic may also be implemented by receiver 140. In one embodiment, logic gates are used to generate the desired output signals according to a specified protocol.

System 100 may employ GTL technology as described in U.S. pat. 5,023,488 to William F. Gunning, which is herein incorporated by reference. In one embodiment, system 100 is coupled to a GTL driver or a GTL+ driver. The +-symbol of GTL+ denotes the use of a PFET pull up transistor coupled to the drain of the NFET pull down transistor at the output of a GTL+ driver. The relatively narrow voltage swings between logical 0 and logical 1 using GTL+ technology facilitates high speed data communication.

In one embodiment, the detector, or receiver, of system 100 is suitable for operation in conjunction with a driver as described in an application for patent entitled GTL+ DRIVER, filed Jul. 20, 2000, bearing Ser. No. 09/620,679, inventor Rodney Ruesch and assigned to the assignee in the instant application, which application is hereby incorporated by reference in its entirety.

Figure 3:
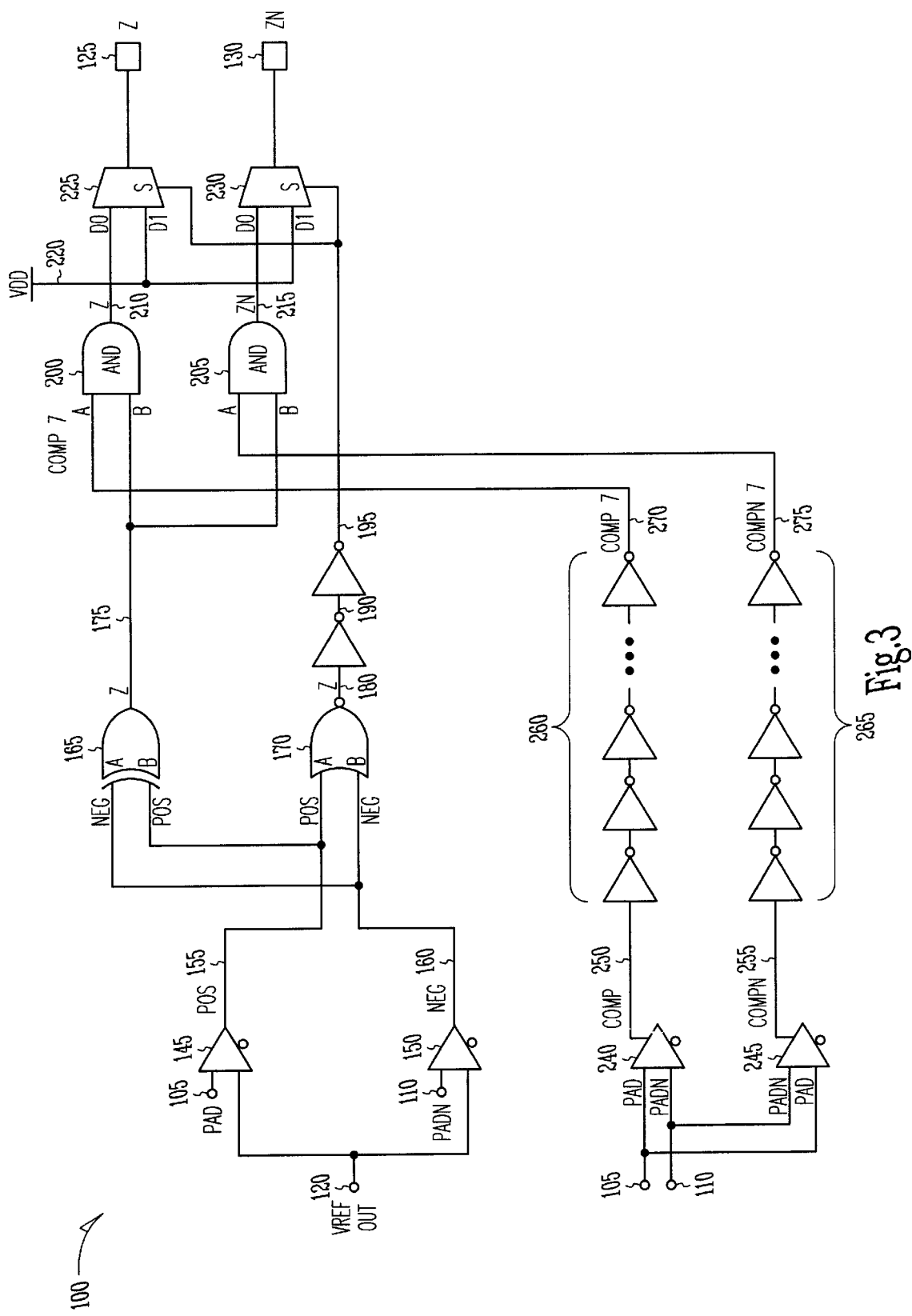
FIG. 3 is a block diagram illustrating generally a portion of one embodiment of the present system.

FIG. 3 illustrates a block diagram for implementing one embodiment of the present system, such as that illustrated in FIG. 2. In the figure, PAD 105, and PADN 110 represent the first and second input node, respectively. A first input to differential amplifier, or comparator, 145 is PAD 105. A second input to differential amplifier 145 is $V_{REFOUT}$ 120. $V_{REFOUT}$ 120 is a voltage source derived from a circuit not shown in FIG. 3. Differential amplifier 145 has a first output, marked POS, and is communicated via line 155. A second differential amplifier 150 has a first input PADN 110 and a second input $V_{REFOUT}$ 120. Differential amplifier 150 has a first output, marked NEG, and is communicated via line 160. Differential amplifiers 145 and 150 perform a comparison of the input signals with the voltage of $V_{REFOUT}$ 120. If the input signals to a differential amplifier differ by more than a predetermined amount, then the output of the differential amplifier will change. For example, in one embodiment, if PAD 105 differs from $V_{REFOUT}$ 120 by more than 200 mV, then the output of differential amplifier 145 will switch from a logic low to a logic high.

A third differential amplifier 240 has a first and second input of PAD 105 and PADN 110, respectively. Differential amplifier 240 has a first output, marked COMP, and is communicated via line 250. A fourth differential amplifier 245 has a first and second input of PADN 110 and PAD 105, respectively. Differential amplifier 245 has a first output, marked COMPN, and is communicated via line 255. In one embodiment, if PAD 105 differs from PAD 110 by more than a predetermined amount, then the output of differential amplifier 240 and differential amplifier 245 will switch from one state to another state. In one embodiment, the predetermined amount is 200 mV.

In one embodiment, logic gates coupled to the output of differential amplifiers 145, 150, 240 and 245 implement the logic of the truth table illustrated in Table 1. In one embodiment, other circuits may be employed to implement logic according to a specified protocol. The logic of one embodiment serves to quantify the output in accordance with a specified protocol.

Continuing with the embodiment of FIG. 3, the output of differential amplifier 145, line 155, is provided to a first input of exclusive or ("XOR") gate 165 and to a first input of inverted or ("NOR") gate 170. The output of differential amplifier 150, line 160 is provided to a second input of XOR gate 165 and to a second input of NOR gate 170. The output of XOR gate 165, on line 175, is coupled to a second input of AND gate 200 and the second input of AND gate 205.

The output of differential amplifier 240, on line 250, is coupled to delay 260. Delay 260, in the embodiment shown, comprises a plurality of series connected invertors. In one embodiment, delay 260 includes eight invertors connected in series. Alternative logic gates, delay lines, or other elements are also contemplated for purposes of providing a delay. The output of delay 260 is denoted as line 270. The output of differential amplifier 245, on line 255, is coupled to delay 265. Delay 265, in the embodiment shown, comprises a plurality of series connected invertors. In one embodiment, delay 265 includes eight invertors connected in series. Alternative logic gates, delay lines, or other elements are also contemplated for purposes of providing a delay. The output of delay 265 is denoted as line 275. AND gate 200 receives a first input on line 270 and AND gate 205 receives a first input on line 275. The output of AND gate 200, denoted as line 210, is coupled to a first input of multiplexer 225. The output of AND gate 205, denoted as line 215, is coupled to a first input of multiplexer 230. The second input of multiplexer 225 and the second input of multiplexer 230 is coupled to supply voltage $V_{DD}$ at node 220. In one embodiment, the voltage of $V_{DD}$ corresponds to that of a logic level high signal.

The output of NOR gate 170, at line 180, is provided to the input of delay 190. Delay 190, in the embodiment shown, comprises a plurality of series connected invertors. In one embodiment, delay 190 includes two invertors connected in series. Alternative logic gates, delay lines, or other elements are also contemplated for purposes of providing a delay. The output of delay 190 is denoted as line 195. Line 195 is coupled to the selector input of multiplexer 225 and to the selector input of multiplexer 230. The output of multiplexer 225 and multiplexer 230 is coupled to node Z and ZN, denoted herein as 125 and 130. The selector input of multiplexer 225 and multiplexer 230 selects the particular input to which the multiplexer output is connected. For example, in one state, the first input of multiplexer 225 (line 210) is coupled to the output of multiplexer 225 (node Z) when line 195 is in a first state and second input of multiplexer 225 (line 220) is coupled to the output of multiplexer 225 (node Z) when line 195 is in a second state.

In the embodiment shown, differential amplifiers 145, 150, 240 and 245 are substantially the same. However, it is contemplated that different differential amplifiers may also be used. For example, in one embodiment, differential amplifiers 145 and 150 may be the same and differential amplifiers 240 and 245 may be the same.

The following is a description of the operation of one embodiment of system 100. Input signals applied to PAD 105 and PAD 110 are compared by differential amplifiers 145, 150, 240 and 245. Assume first that PAD 105 and PAD 110 are at logic level 1 and 0, respectively, and $V_{REFOUT}$ 120 is at a voltage approximately midway between a voltage corresponding to logic level 1 and 0. In one embodiment, $V_{REFOUT}$ 120 corresponds to the voltage level marked 60 in FIG. 1A. In this condition, according to one embodiment of system 100, the output of differential amplifier 145 will be high (logic "1") and the output of differential amplifier 150 will be 0. With a 1 and 0 applied to the input of XOR 165, the output, at line 175, will be 1. With a 1 and 0 applied to the input of NOR 170, the output, at line 180, will be 0. After propagating through delay 190, here shown as two invertors, line 195 will remain 0 and be thus, applied to the selector of multiplexer 225 and the selector of multiplexer 230. The output of multiplexer 225 will be determined by the output of AND gate 200, and thus, Z will be 1 and the output of multiplexer 230 will be determined by the output of AND gate 205, and thus, ZN will be 0. It will be recognized that in this example, Z 125 matches PAD 105 and ZN 130 matches PADN 110.

If it is assumed that PAD 105 and PAD 110 are at logic level 0 and 1, respectively, then the outputs also would be reversed, namely, Z 125 at logic 0 and ZN 130 at logic 1.

If it is assumed that PAD 105 and PAD 110 are both at logic level 1, then results are as follows. The output of differential amplifiers 145 and 150 will both be 1, and when applied to the inputs of XOR 165, line 175 will be 0. When NOR 170 is provided with both inputs at 1, then line 180 is at logic 0 and Z 125 and ZN 130 will be determined by the output of AND gate 200 and AND gate 205, each of which are at logic 0. Consequently, Z 125 and ZN 130 will both be at logic level 0.

If it is assumed that PAD 105 and PAD 110 are both at logic level 0, then the results are opposite, namely, both outputs Z 125 and ZN 130 will be at logic 1. In this case, the output of the XOR gate 165 will be logic 0 and the output of NOR gate 170 will be at logic 1. Both multiplexer 225 and multiplexer 230 will have selector inputs set to 1, in which case $V_{DD}$ 220 will be the input, and Z 125 and ZN 130 will be both at logic 1.

Figure 4:
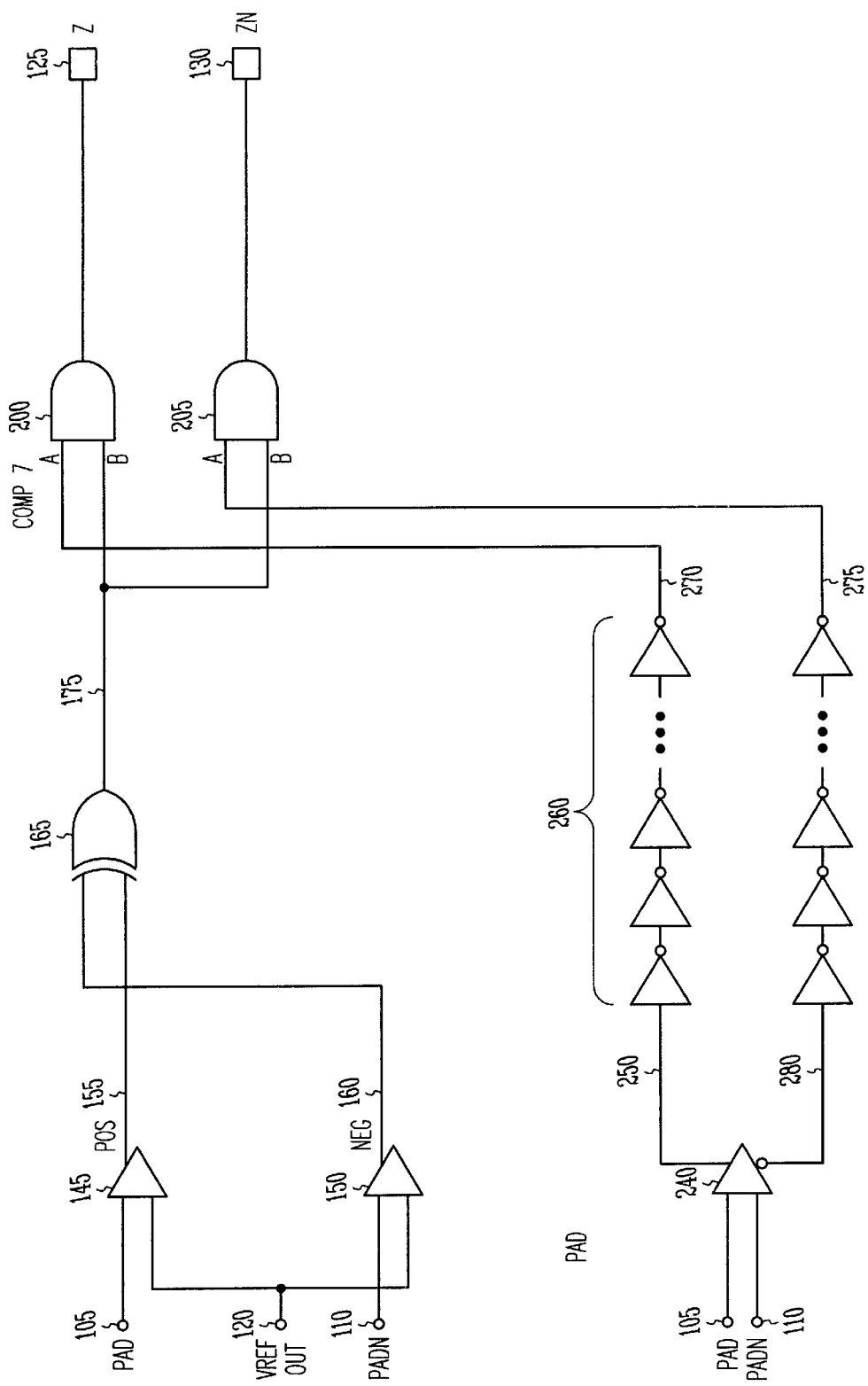
FIG. 4 is a block diagram illustrating generally a portion of one embodiment of the present system.

FIG. 4 illustrates another embodiment of the present system. In the figure, differential amplifier 240 provides an output on line 250 and a complementary output on line 280. Lines 250 and 280 are routed through delays 260 and 265, respectively. In one embodiment, not shown in the figures, the output lines from delay 260 and delay 265 are routed to AND gates 200 and 205 as described relative to FIG. 3.

In one embodiment, the logic protocol provides that a logical input state of 0 and 0, on PAD 105 and PADN 110, is not allowed. In such a case, the embodiment of FIG. 4 is operable. It will be noted that the NOR gate 170, multiplexer 225 and multiplexer 230 are omitted. In FIG. 4, AND gate 200 receives input signals from XOR 165 and line 270 and AND gate 205 receives input signals from XOR 165 and line 275.

Other circuit or logic variations are also contemplated. For example, delay 260 and 265 may be located differently than in the figures. In one embodiment, delay 260 is coupled in series with PAD 105 and the first input to differential amplifier 240 and delay 265 is coupled in series with PAD 110 and the second input to differential amplifier 240, and output 250 is coupled directly to an input of AND gate 200 and complementary output 280 is coupled directly to an input of AND gate 205. As another example of a variation, the present system may include three differential amplifiers, namely 145, 150 and 240 (of FIG. 4) coupled with multiplexer 225 and multiplexer 230 (of FIG. 3).

The differential amplifiers used in one embodiment of the present system is described as follows. To discern the state of the input signals on the differential amplifier, an amount of hysteresis is provided. Hysteresis provides information concerning the previous state of the differential inputs. Hysteresis is helpful in determining if the signal inputs are merely noisy or have actually changed states. In one embodiment, the differential amplifiers respond to detection of a predetermined voltage differential before changing output states. In one embodiment, the differential amplifiers introduce 200 picoseconds of hysteresis which corresponds to a 200 millivolts (mV) voltage difference. In other words, without 200 mV of differential, the amplifier output remains unchanged. Larger or smaller amounts of differential are also contemplated. In one embodiment 200 mV was selected to provide a desired amount of noise margin.

Referring again to FIG. 1A, various voltages are illustrated by dashed lines at 55, 60 and 65. The voltage at line 60 represents $V_{REFOUT}$ 120 and the voltage difference between 55 and 65 represents twice 200 mV, or 400 mV. In one embodiment, if the difference between input voltages, for example, PAD 105 and $V_{REFOUT}$ 120, is greater than 200 mV, that is, the voltage on PAD 105 is outside the region bounded by lines 55 and 65, then the state of differential amplifier 145 will change. Also, when PAD 105 and PADN 110 differ by an amount greater than 200 mV, the state of differential amplifier 240, (and differential amplifier 245 of FIG. 3), will change.

FIG. 5 illustrates schematically one embodiment of a differential amplifier. In particular, FIG. 5F illustrates a cross coupled latch at the input of the differential amplifier portion of the circuit of FIG. 5J. In one embodiment, the cross coupled latch may be a pair of back to back invertors comprising four field effect transistors ("FETs"). In one embodiment, the amount of hysteresis increases as the size of the transistors of FIG. 5F is increased. In one embodiment, the amount of hysteresis increases as the number of transistors of FIG. 5F is increased. Larger, or more numerous, transistors yields a greater amount of hysteresis, and thus a greater amount of noise margin. In the embodiment shown, the transistors of FIG. 5F are made sufficiently large to generate a predetermined amount of hysteresis. In one embodiment the amount of hysteresis is 200 picoseconds, although amounts greater or less than this value can also be used. Hysteresis creates a dead band in which the state of the output of the differential amplifier remains unchanged unless the input remains constant for a sufficiently long period of time. In one embodiment, 200 picoseconds of hysteresis corresponds to 200 millivolts of voltage differential.

Figure 5E:
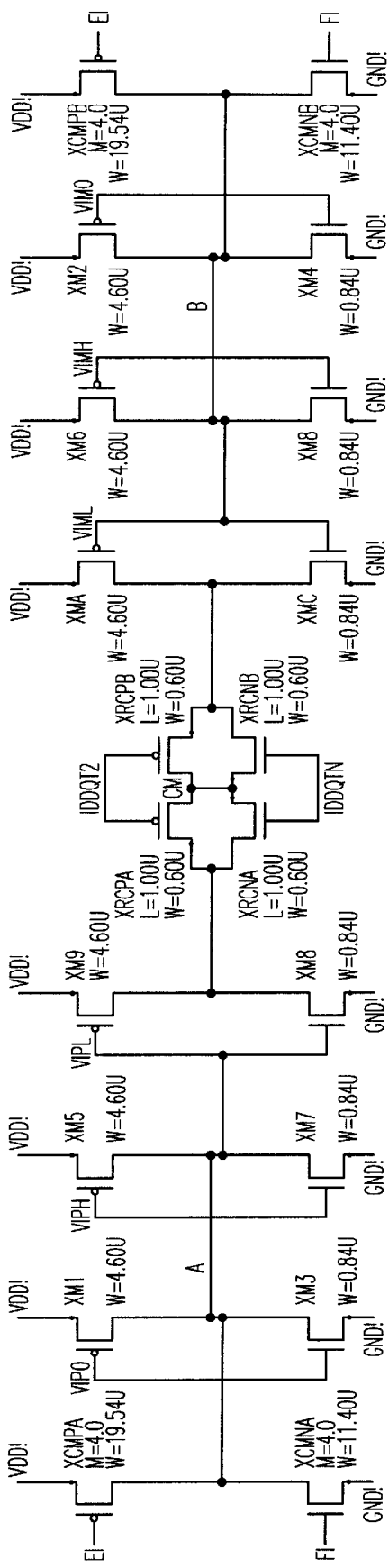
FIG. 5 is a schematic illustrating generally portions of one embodiment of the present system.
Figure 5F:
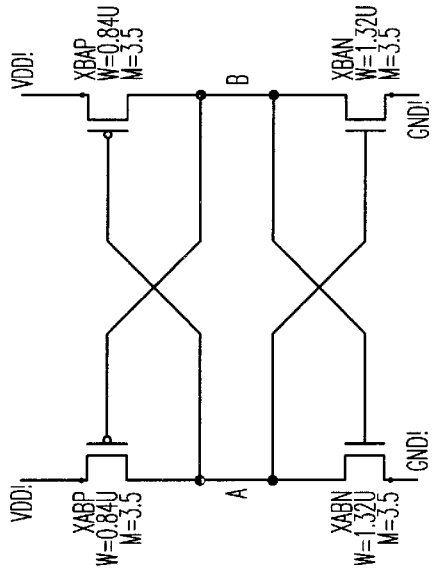
Figure 5G:
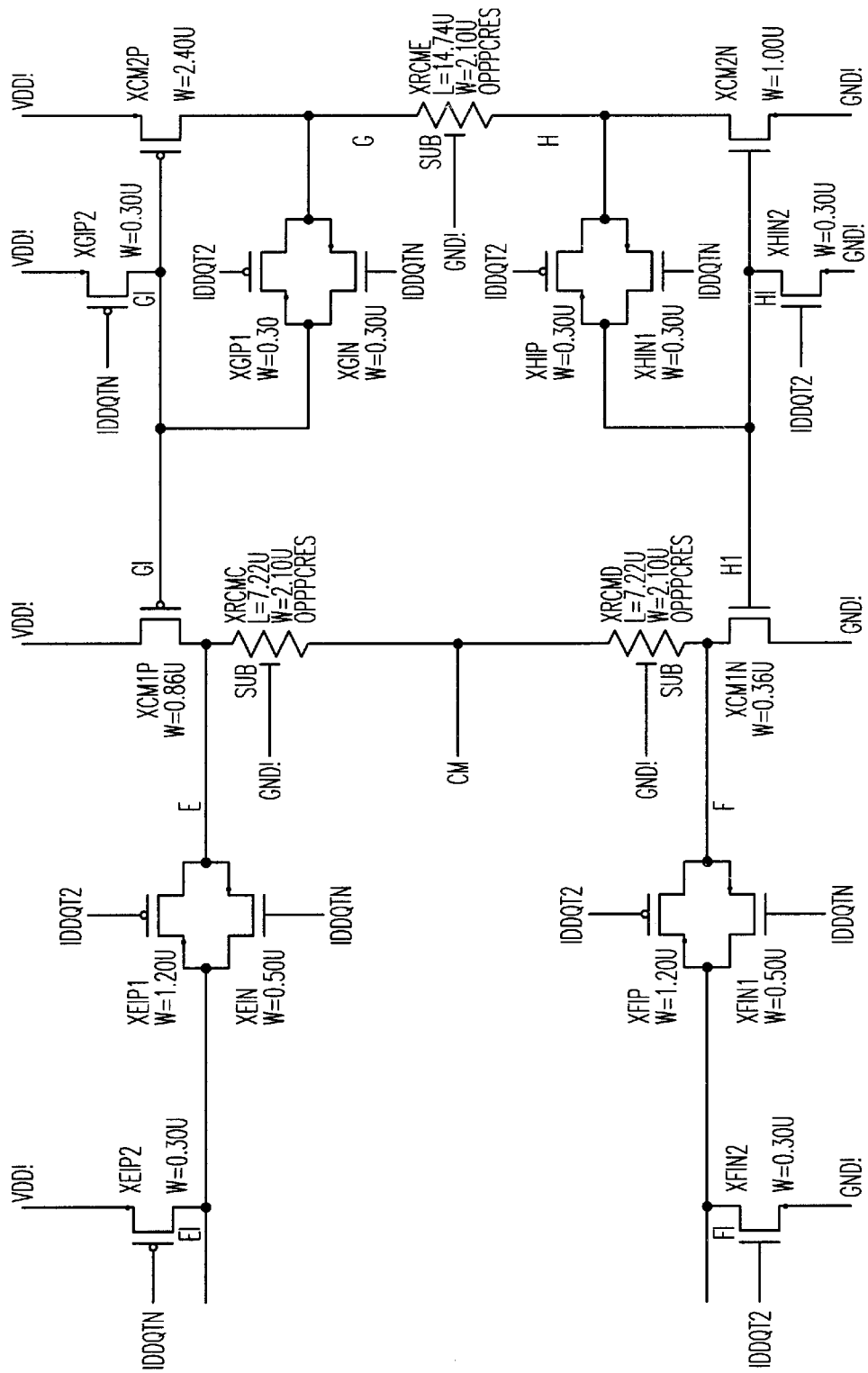
Figure 5H:
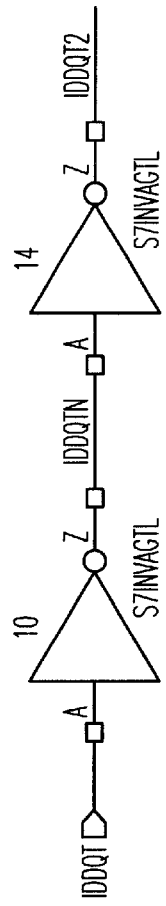
Figure 5J:
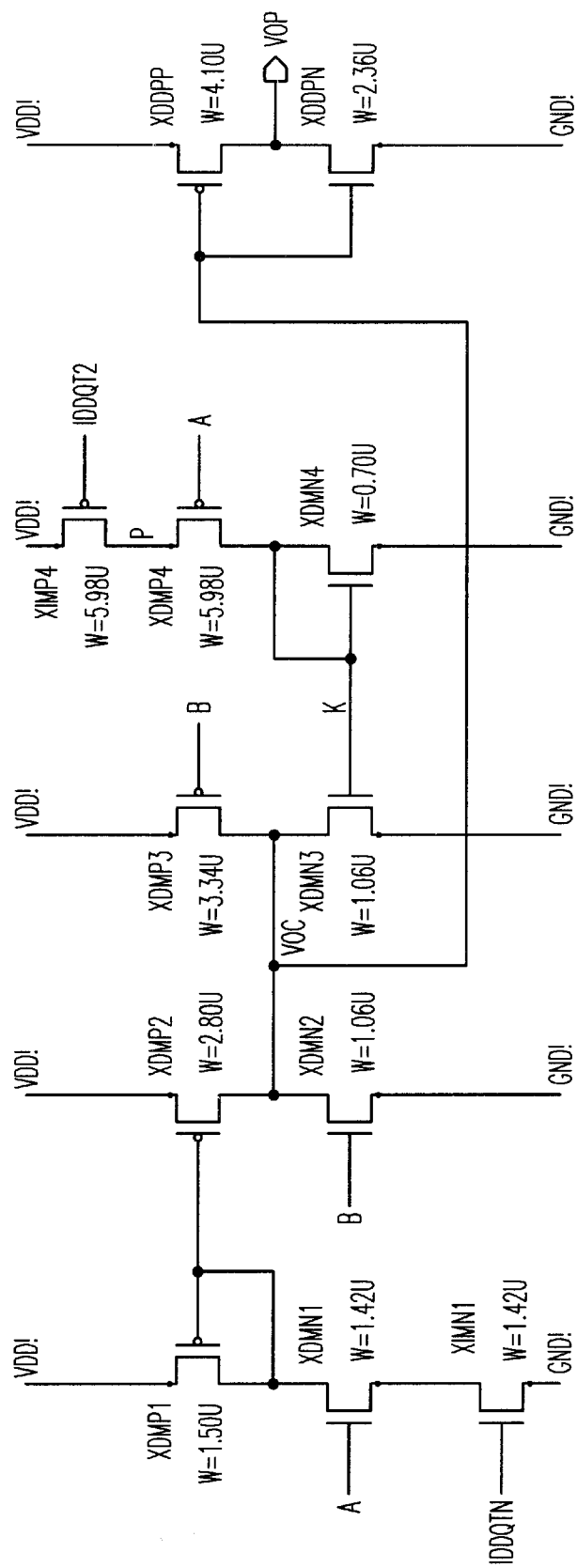
Figure 6A:
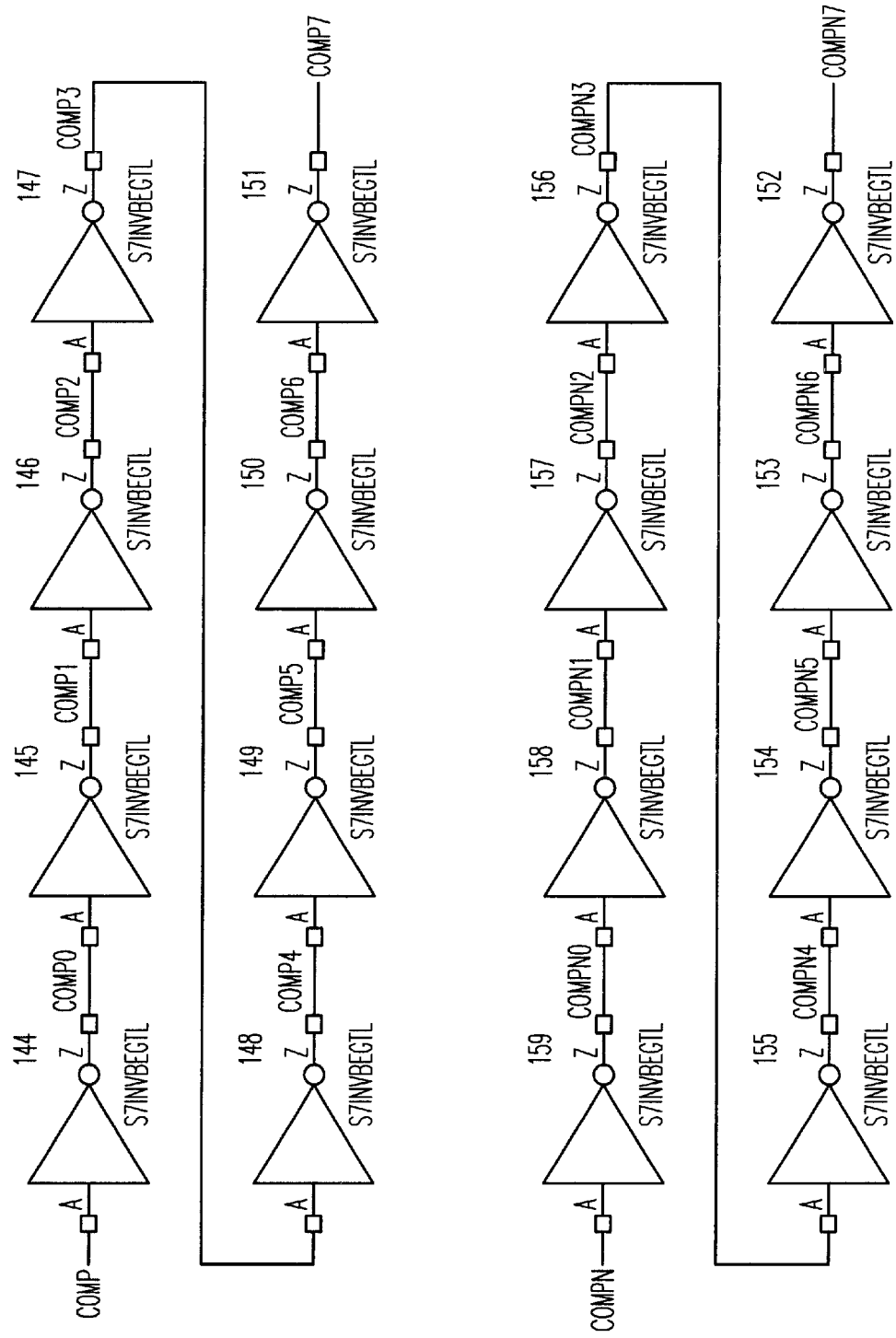
FIG. 6 is a block diagram illustrating generally portions of one embodiment of the present system.
Figure 6C:
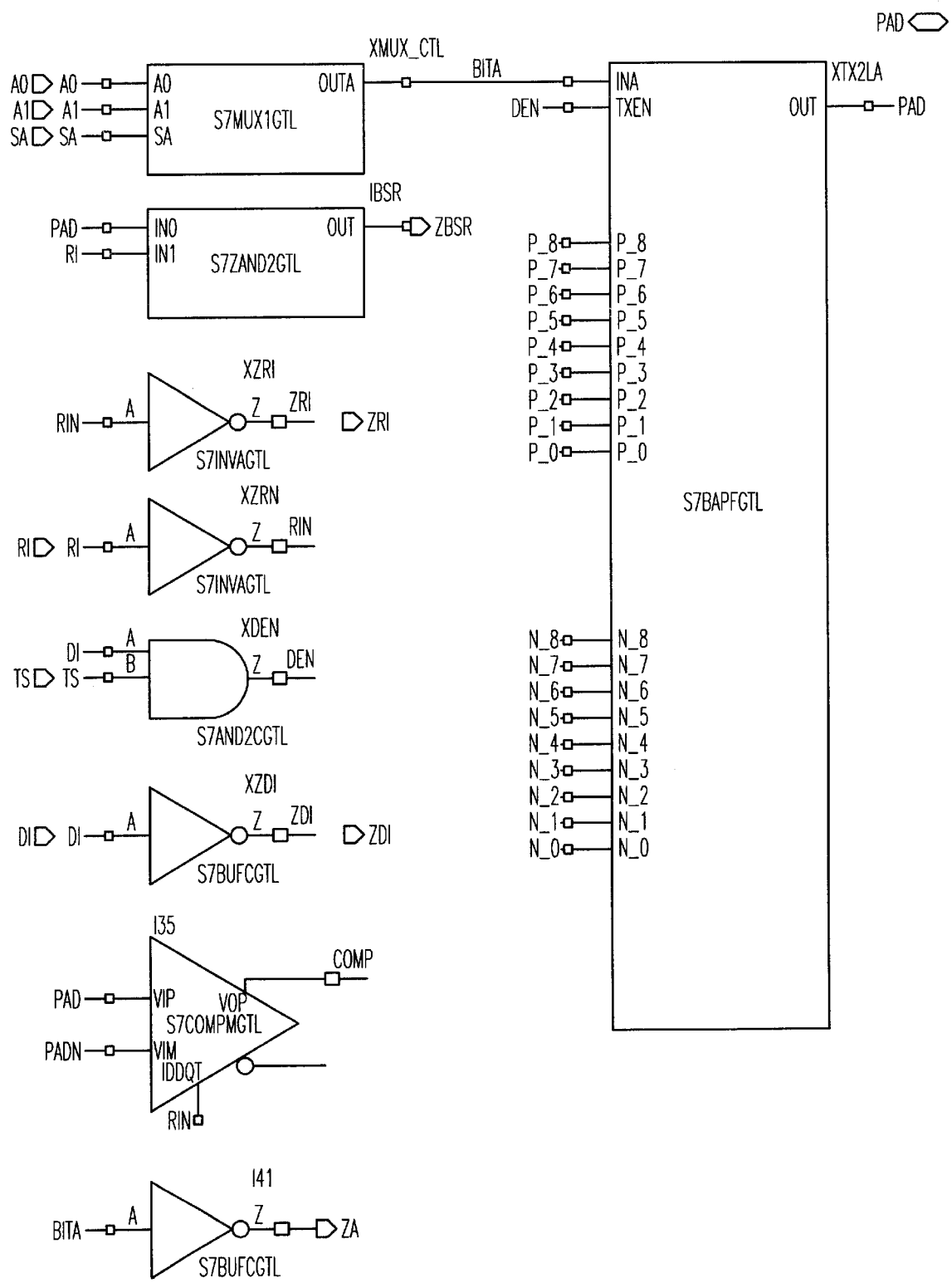
Figure 6D:
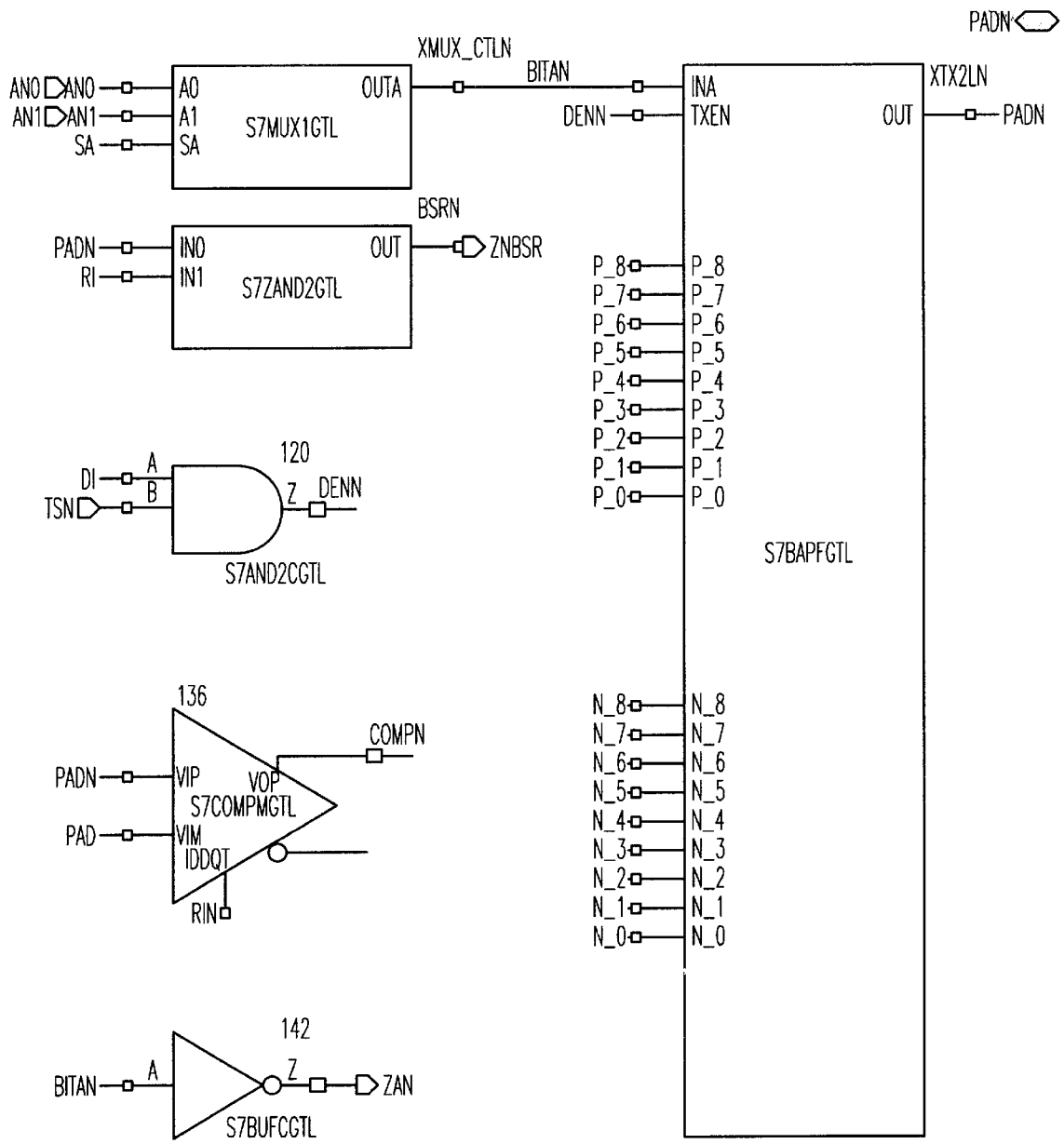
Figure 6E:
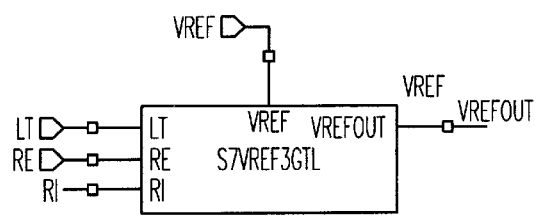
Figure 6F:
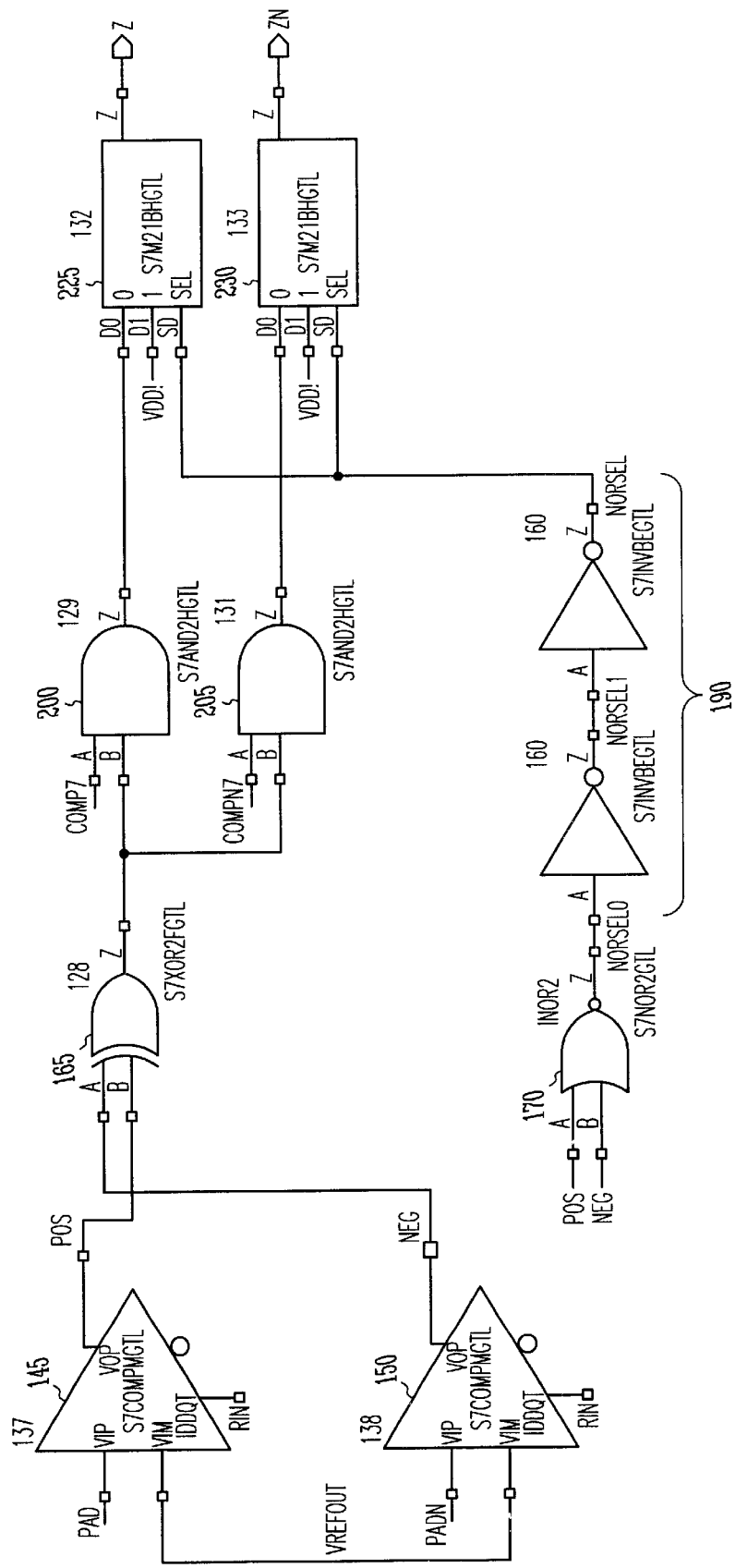

FIG. 5F illustrates FETs, however, other types of transistors may also be used, including gallium arsenide, silicon on insulator and biCMOS.

Referring again to FIGS. 3 and 4, delay 260 and delay 265 equalize the signal propagation through the logic gates as illustrated. The circuits illustrated in FIGS. 3 and 4 provide a uniform signal propagation. In other words, whether the input signals are differential or non-differential (single ended), the propagation delay remains substantially constant. In this manner, the signal can be reliably processed at terminals Z and ZN after a predetermined, and uniform, period of time after having been presented to the input nodes at PAD and PADN. In one embodiment, propagation through the circuit of FIG. 3 or FIG. 4 is on the order of 500 picoseconds.

At least one embodiment of the present system eliminates the complexity associated with processing single ended input signals. Previous attempts have used dedicated power supplies along with specialized differential amplifiers having zero gain. Such attempts often fail since variations in performance of the differential amplifier, due to manufacturing process differences, voltage differences and temperature differences may actually result in small levels of gain in cases where the input voltages are virtually the same. The small amount of gain may result in erroneous signal outputs. The present system overcomes this shortfall.

FIG. 6 provides additional detail concerning various portions of the circuits described previously. For example, FIG. 6A depicts one embodiment of delay 260 and delay 265 comprising of a pair of series connected invertors. FIG. 6B illustrates a plurality of invertors associated with one embodiment of the present system. FIG. 6C illustrates, in part, differential amplifier 145 of one embodiment of the present system. FIG. 6D illustrates, in part, differential amplifier 150 of one embodiment of the present system. FIG. 6E illustrates, a block diagram of circuitry associated with $V_{REFOUT}$ 120 of one embodiment of the present system. FIG. 6F illustrates, in part, differential amplifiers 145 and 150, XOR gate 165, NOR gate 170, AND gate 200, AND gate 205, delay 190 and multiplexers 225 and 230 of one embodiment of the present system.

Figures 1, 7:
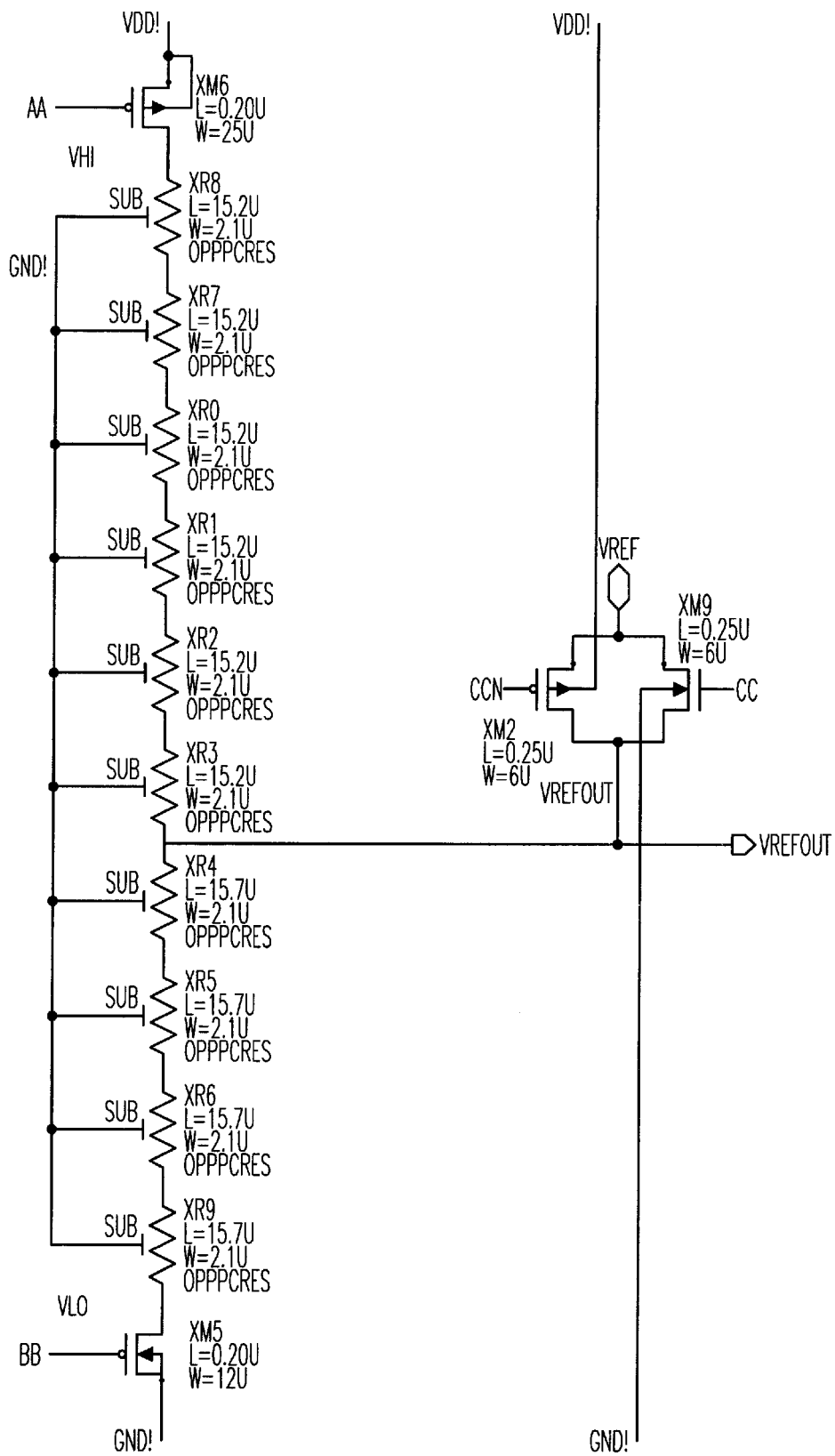
FIG. 7 illustrates generally portions of one embodiment of the present system.

FIG. 7 illustrates portions of circuitry associated with one embodiment of the present system. For example, FIG. 7A illustrates one embodiment of circuitry for providing $V_{REFOUT}$ 120. The figure shows a series divider network of resistors coupled from power supply to ground. In one embodiment, the resistance of the network is adjusted to derive the desired voltage. In one embodiment, the desired voltage is derived from a predetermined connection within the network. In one embodiment, the network resistor network includes FETs having large capacitance. The configuration of the large capacitance and the resistors provide a low pass filter network. It is believed that the low pass filter network provides a quieter reference voltage to the differential amplifiers. In one embodiment, the reference voltage for differential amplifiers 145 and 150 is generated by external circuitry and coupled to a terminal on the present system. In one embodiment, the reference voltage is generated internally.

Test Mode

In one embodiment of the present system, provisions to enable testing of the interconnections and functionality of the circuitry is provided. In one embodiment, a boundary scan mode is provided. When operating in boundary scan mode, the clock frequency is substantially slower. For example, scan mode may operate at 25 MHz whereas functional operation may be at 400 MHz or more. With reference to FIG. 8, output scan testing is accommodated by means of nodes ZBSR 305 and ZNBSR 310 and the associated AND gates 315 and 320. Nodes ZBSR 305 and ZNBSR 310 correspond to the outputs of PAD and PADN when node RI 325 is high. AND gates 315 and 320 enable large loads to be coupled to the output without interfering with normal functionality of the present system. In one embodiment, the boundary scan circuitry eliminates the scan loading from the system path.

In one embodiment, the input circuitry to a corresponding driver circuit may also be tested. In FIG. 8, nodes A0 and A1 are selectable by means of a multiplexer using node SA. Also, nodes AN0 and AN1 may be selected by means of the multiplexer using node SA. During testing, test signals may be applied to first node of each pair and during normal operations, the input signals are applied to the second node of each pair. Selection of inputs using a multiplexer facilitates testing without unduly burdening the normal operation of the device with excessive loading.

Figure 9:
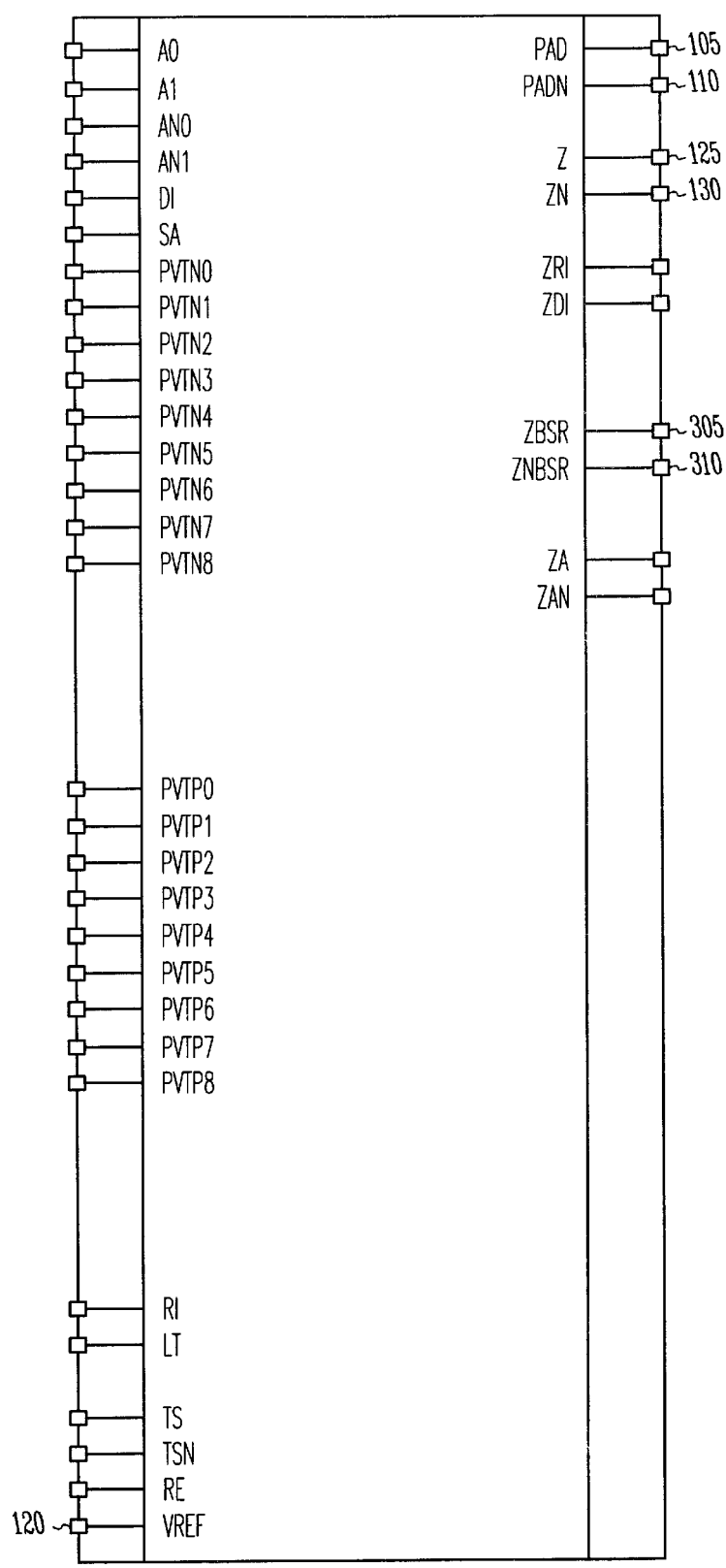
FIG. 9 illustrates one embodiment of the present system.

FIG. 9 illustrates a model of one embodiment of the present system. In the embodiment shown, the aforementioned terminals PAD 105, PADN 110, Z 125, ZN 130, ZBSR 305, ZNBSR 310, $V_{REFOUT}$ 120 and others are marked accordingly.

FIG. 10 illustrates a truth table for one embodiment of the present system. In the figure, RI represents a receiver inhibit input, RE represents reference enable, and ZRI represents receiver inhibit output (RI out). Other truth tables are also contemplated. For example, and not by way of limitation, one embodiment provides that when PAD and PADN are the same, then Z and ZN also match.

CONCLUSION

Although specific embodiments have been illustrated and described herein, it will be appreciated by those of ordinary skill in the art that any arrangement which is calculated to achieve the same purpose may be substituted for the specific embodiment shown. For example, rather than FET technology, the present system may be implemented in bipolar, BiCMOS, gallium arsenide, silicon on insulator, or other technology. This application is intended to cover any adaptations or variations of the present invention.

What is claimed is:

1. A receiver comprising:
    a first comparator coupled to a first input signal, a second input signal and a reference input signal, the first comparator generating a first output and a second output based on the input signals;
    a second comparator coupled to the first input signal and the second input signal, the second comparator generating a third output and a fourth output based on the first input signal and the second input signal; and
    a logic array having a first input coupled to the first output, a second input coupled to the second output, a third input coupled to the third output, and a fourth input coupled to the fourth output, the logic array having a first output signal node and a second output signal node wherein the first output signal node provides a first output signal and the second output signal node provides a second output signal, and further wherein the first output signal and the second output signal is based on the first input, second input, third input and fourth input.

2. The receiver of claim 1 wherein the first comparator comprises a first differential amplifier and a second differential amplifier, wherein the first differential amplifier is coupled to the first input signal and the reference input signal and the second differential amplifier is coupled to the second input signal and the reference input signal.

3. The receiver of claim 1 wherein the second comparator comprises a third differential amplifier and wherein the third output is complementary to the fourth output.

4. The receiver of claim 1 wherein the second comparator comprises a third differential amplifier and a fourth differential amplifier and wherein the third output is generated by the third differential amplifier and the fourth output is generated by the fourth differential amplifier.

5. The receiver of claim 1 wherein the first input of the logic array couples to a first input of a logical exclusive OR gate and wherein the second input of the logic array couples to a second input of the logical exclusive OR gate.

6. The receiver of claim 1 wherein the first input of the logic array couples to a first input of a logical NOR gate and wherein the second input of the logic array couples to a second input of the logical NOR gate.

7. The receiver of claim 1 wherein the first input of the logic array couples to a first input of a logical exclusive OR gate and wherein the second input of the logic array couples to a second input of the logical exclusive OR gate, and further wherein the exclusive OR gate comprises an output coupled to a first input of a first logical AND gate and a first input of a second logical AND gate.

8. The receiver of claim 1 wherein the first input of the logic array couples to a first input of a logical exclusive OR gate and wherein the second input of the logic array couples to a second input of the logical exclusive OR gate, and further wherein the exclusive OR gate comprises an output coupled to a first input of a first logical AND gate and a first input of a second logical AND gate and further wherein the third input of the logical array is coupled to a second input of the first logical AND gate and the fourth input of the logical array is coupled to a second input of the second logical AND gate, and wherein the first logical AND gate has an output coupled to the first output signal node of the logic array and wherein the second logical AND gate has an output coupled to the second output signal node of the logic array.

9. The receiver of claim 1 wherein the logic array comprises a plurality of logical inverters.

10. The receiver of claim 1 wherein the logic array comprises a multiplexer.

11. A circuit comprising:
    a first differential amplifier comprising:
        a first output coupled to a first input of an exclusive OR gate;
        a first input coupled to a first input node;
        a second input coupled to a reference voltage;
    a second differential amplifier comprising:
        a first output coupled to a second input of the exclusive OR gate, the exclusive OR gate having an exclusive OR gate output coupled to a first input of a first AND gate, the exclusive OR gate output further coupled to a first input of a second AND gate;
        a first input coupled to a second input node;
        a second input coupled to the reference voltage; and
    a third differential amplifier comprising:
        a first output coupled to an input of a first delay, the first delay having an output coupled to a second input of the first AND gate, the first AND gate having an output coupled to a first output node;
        a second output coupled to an input of a second delay, the second output having a state complementary to the first output of the third differential amplifier, the output of the second delay coupled to a second input of the second AND gate, the second AND gate having an output coupled to a second output node;
        a first input coupled to the first input node; and
        a second input coupled to the second input node.

12. The circuit of claim 11 wherein the first output of the first differential amplifier is delayed by a predetermined time period after receipt of a signal on the first input of the first differential amplifier and receipt of a signal on the second input of the first differential amplifier, and wherein the first output of the second differential amplifier is delayed by the predetermined time period after receipt of a signal on the first input of the second differential amplifier and receipt of a signal on the second input of the second differential amplifier, and further wherein the first output of the third differential amplifier and the second output of the third differential amplifier are delayed by the predetermined time period after receipt of a signal on the first input of the third differential amplifier and receipt of a signal on the second input of the third differential amplifier.

13. The circuit of claim 11 wherein the reference voltage is between a voltage representing a logical one and a voltage representing a logical zero.

14. The circuit of claim 11 wherein the reference voltage is substantially midway between a voltage representing a logical one and a voltage representing a logical zero.

15. The circuit of claim 11 wherein the first delay comprises a first logic gate and the second delay comprises a second logic gate.

16. The circuit of claim 11 wherein the first delay comprises a first plurality of series connected invertors and the second delay comprises a second plurality of series connected invertors.

17. The circuit of claim 11 wherein the first delay has a first propagation delay time and the second delay has a second propagation delay time and wherein the first propagation delay time is approximately equal to the second propagation delay time.

18. The circuit of claim 11 wherein the first delay has a first propagation delay time and the fix exclusive OR gate has a second propagation delay time and the first propagation delay time is approximately equal to the second propagation delay time.

19. The circuit of claim 11 wherein the first output of the first differential amplifier changes state if the first input of the first differential amplifier and the second input of the first differential amplifier differs by a predetermined amount.

20. The circuit of claim 11 wherein the first output of the first differential amplifier changes state if the first input of the first differential amplifier and the second input of the first differential amplifier differs by approximately 200 millivolts.

21. The circuit of claim 11 wherein the first differential amplifier comprises a cross coupled latch having relatively large transistors.

22. The circuit of claim 11 wherein the first differential amplifier, the second differential amplifier, and the third differential amplifier each have a predetermined amount of hysteresis.

23. A circuit comprising:
   a first differential amplifier having a first differential amplifier first output, a first differential amplifier first input coupled to a first input node and a first differential amplifier second input coupled to a reference voltage;
   a second differential amplifier having a second differential amplifier first output, a second differential amplifier first input coupled to a second input node and a second differential amplifier second input coupled to the reference voltage;
   an exclusive OR gate having an exclusive OR gate output, an exclusive OR gate first input, and an exclusive OR gate second input, the exclusive. OR gate first input coupled to the second differential amplifier first output and the exclusive OR gate second input coupled to the first differential amplifier first output;
   a NOR gate having a NOR gate output, a NOR gate first input and a NOR gate second input, the NOR gate first input coupled to the first differential amplifier first output and the NOR gate second input coupled to the second differential amplifier first output;
   a first delay having a first delay output and a first delay input, the first delay input coupled to the NOR gate output;
   a third differential amplifier having a third differential amplifier first output, a third differential amplifier first input coupled to the first input node and a third differential amplifier second input coupled to the second input node;
   a fourth differential amplifier having a fourth differential amplifier first output, a third differential amplifier first input coupled to the second input node and a fourth differential amplifier second input coupled to the first input node;
   a second delay having a second delay output and a second delay input, the second delay input coupled to the third differential amplifier first output;
   a third delay having a third delay output and a third delay input, the third delay input coupled to the fourth differential amplifier first output;
   a first AND gate having a first AND gate output, a first AND gate first input coupled to the second delay output, and a first AND gate second input coupled to the exclusive OR gate output;
   a second AND gate having a second AND gate output, a second AND gate first input coupled to the third delay output, and a second AND gate second input coupled to the exclusive OR gate output;
   a first multiplexer having a first multiplexer output coupled to a first output node, a first multiplexer first input coupled to the first AND gate output and a first multiplexer second input coupled to a supply voltage and a first multiplexer selector coupled to the first delay output; and
   a second multiplexer having a second multiplexer output coupled to a second output node, a second multiplexer first input coupled to the second AND gate output and a second multiplexer second input coupled to the supply voltage and a second multiplexer selector coupled to the first delay output.

24. The circuit of claim 23 wherein the first delay comprises a plurality of inverters.

25. The circuit of claim 23 wherein the reference voltage is less than the supply voltage.

26. The circuit of claim 23 wherein the reference voltage is approximately two thirds of the supply voltage.

27. The circuit of claim 23 wherein the first differential amplifier, the second differential amplifier, the third differential amplifier and the fourth differential amplifier are approximately the same.

28. The circuit of claim 23 wherein the first differential amplifier, the second differential amplifier, and the third differential amplifier each have a predetermined amount of hysteresis.

29. A method comprising:
   receiving a first input signal;
   receiving a second input signal at a time concurrent with receipt of the first input signal;
   adding a predetermined time lag to the first input signal to create a delayed first input signal;
   adding the predetermined time lag to the second input signal to create a delayed second input signal;
   setting a first signal line based on a comparison of the delayed first input signal with the delayed second input signal;
   setting a second signal line based on the comparison of the delayed first input signal with the delayed second input signal, the second signal line complementary to the first signal line;
   setting a third signal line based on a comparison of the delayed first input signal with a reference signal;
   setting a fourth signal line based on a comparison of the delayed second input signal with the reference signal;

executing a logical exclusive or function using the third signal line and the fourth signal line to create a fifth signal;

adding a predetermined delay to the first signal line to create a delayed first signal line;

adding the predetermined delay to the second signal line to create a delayed second signal line;

executing a logical AND function using the fifth signal line and the delayed first signal line to create a first output; and executing a logical AND function using the fifth signal line and the delayed second signal line to create a second output.

30. The method of claim 29 wherein setting a first signal line comprises processing using a differential amplifier.

31. The method of claim 29 wherein setting a third signal line comprises processing using a differential amplifier.

32. The method of claim 29 wherein adding a predetermined delay comprises executing a plurality of logical gates.

* * * * *